United States Patent [19]
Kanemaru et al.

[11] 4,291,297
[45] Sep. 22, 1981

[54] SINGLE RAMP COMPARISON ANALOG TO DIGITAL CONVERTER

[75] Inventors: Kenji Kanemaru, Musashino; Takashiro Iwasaki, Tokyo, both of Japan

[73] Assignee: Hitachi, Ltd., Tokyo, Japan

[21] Appl. No.: 927

[22] Filed: Jan. 4, 1979

Related U.S. Application Data

[63] Continuation of Ser. No. 809,007, Jun. 22, 1977, abandoned.

[51] Int. Cl.³ .............................................. H03K 13/20
[52] U.S. Cl. ............................................ 340/347 AD
[58] Field of Search ................... 340/347 M, 347 AD; 302/356

[56] References Cited
U.S. PATENT DOCUMENTS

| | | | |
|---|---|---|---|
| 3,111,662 | 11/1963 | Pierce | 340/347 AD |
| 3,258,764 | 6/1966 | Muniz | 340/347 AD |
| 3,564,406 | 2/1971 | Henderson | 340/347 AD |
| 3,678,505 | 7/1972 | Mostyn | 340/347 AD |
| 3,737,897 | 6/1973 | Cuthbert | 340/347 AD |
| 3,750,142 | 7/1973 | Barnes | 340/347 M |
| 3,886,541 | 5/1975 | Watson | 340/347 AD |

FOREIGN PATENT DOCUMENTS

2198318 of 1974 France.

OTHER PUBLICATIONS

Author unclear: "Transistor Gijutsu" Jan. 1975, pp. 100-101.

Grieder, "Elkktronische Rundschau" vol. 14, No. 10, Oct. 1960, pp. 401-402.

*Primary Examiner*—Charles D. Miller
*Attorney, Agent, or Firm*—Craig and Antonelli

[57] ABSTRACT

An analog-to-digital converter of integration type comprises a charging and discharging capacitor, a first comparator for comparing an analog input voltage with the terminal voltage of the capacitor, a second comparator for comparing a reference voltage predetermined in relation to the input voltage with the terminal voltage of the capacitor, a switching transistor connected in parallel with the capacitor for controlling the charging and discharging of the capacitor, and a gated logic circuit applied with outputs of the first and second comparators, a charge-discharge control pulse, and a clock pulse.

When the terminal voltage of the capacitor decreases below the reference voltage during discharge through the switching transistor, the discharge is stopped and a converted output is generated through the gated logic circuit on the basis of the outputs of the comparators. When the terminal voltage increases above the input voltage during charging, the converted output is stopped. The conversion speed and the conversion accuracy are improved and are not influenced by the dispersion of the elements in the discharging path. This converter is suitable for an exposure display system employing an IC for use in a camera. In such a case, the reference voltage may be selected at a value slightly lower than the voltage corresponding to the brightness of the scene on a rainy day.

8 Claims, 7 Drawing Figures

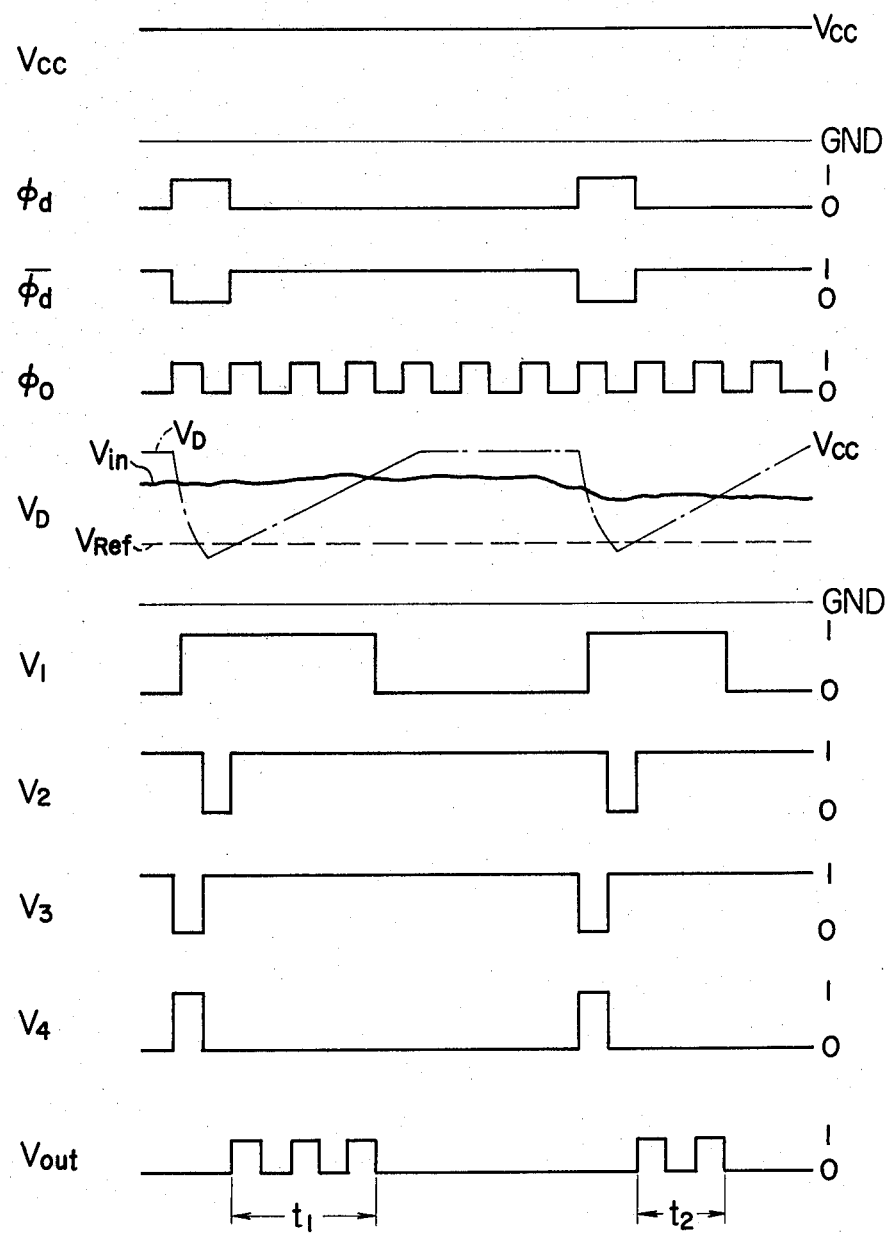

SINGLE RAMP COMPARISON ANALOG TO DIGITAL CONVERTER

This is a continuation of application Ser. No. 809,007, filed June 22, 1977, now abandoned.

BACKGROUND OF THE INVENTION

1. Field of the Invention

This invention relates to an analog-to-digital (A-D) converter, and more particularly to a voltage-time conversion type A-D converter or an integration type A-D converter.

2. Description of the Prior Art

A voltage-time conversion type A-D converter as shown in FIG. 5 is generally known. For example, a system block diagram of such a circuit is shown in FIG. 1, page 101 of Japanese publication "Transistor Gijutsu" issued January 1975.

In FIG. 5, a capacitor $C_o$ and a switching transistor $Q_o$ are connected in parallel with each other and between a constant current source $I_o$ and the ground potential to form a charging and discharging circuit. The other end of the constant current source $I_o$ is connected to a supply voltage source terminal $V_{cc}$. A comparator $A_o$ has a positive input terminal connected to an input terminal $V_{in}$ applied with an analog input voltage and a negative input terminal connected to the interconnection point of the constant current source $I_o$ and the charging and discharging circuit to be applied with the output of the charging and discharging circuit. The switching transistor $Q_o$ of the charging and discharging circuit is driven by a clock pulse $\overline{\phi}_d$ arriving at a certain (longer) time interval. The output voltage $V_o$ of the voltage comparator $A_o$ and an inverted pulse $\phi_d$ formed by inverting the charging and discharging clock pulse signal $\overline{\phi}_d$ in an inverter $L_5$ are applied to an AND logic circuit $L_6$ together with a successively arriving clock pulse signal $\phi$ of a shorter period. The output $V_{out}$ of this AND circuit $L_6$ constitutes the converted output.

Operational principle of this circuit is as follows.

When the charging and discharging clock pulse $\overline{\phi}_d$ is at a high level "H" ("1" level), the switching transistor $Q_o$ is turned on and hence the charge stored on the capacitor $C_o$ is discharged through the transistor $Q_o$. If the capacitance $C_o$ is selected to be small, this discharge is achieved relatively rapidly and completely. Then, the terminal voltage of the capacitor $C_o$ becomes zero volts, which is lower than the input voltage $V_{in}$. Thus, the comparator $A_o$ generates a high level "H" at the output $V_o$. Then, when the charging and discharging clock pulse $\overline{\phi}_d$ becomes of "L" level ("0" level), the inverted output $\overline{\phi}_d$ becomes of "H" level.

Here, the switching transistor $Q_o$ becomes turned off to cut off the discharging path of the capacitor $C_o$. Then, the capacitor $C_o$ is gradually charged up by the current from the constant current souce $I_o$ and accordingly the terminal voltage thereof gradually increases. Denoting the period of "L" level of the pulse signal $\overline{\phi}_d$ as $T_d$, the maximum terminal voltage $V_{max}$ of the capacitor $C_o$ is $I_o T_d / C_o$. During the period $t_1$ when the clock pulse $\overline{\phi}_d$ is at the "L" level and when the terminal voltage of the capacitor $C_o$ is lower than the input voltage $V_{in}$, the output voltage $V_o$ of the voltage comparator $A_o$ is at the "H" level and hence the AND logic circuit $L_6$ transmits the waveform of the successively incoming clock pulse $\phi$ to the output $V_{out}$. When the terminal voltage of the capacitor $C_o$ exceeds the input voltage $V_{in}$, the relation of the inputs of the voltage comparator $A_o$ is changed. Thus, the output $V_o$ of the comparator $A_o$ is inverted to the "L" level. Therefore, the gate of the AND circuit $L_6$ is closed and the output $V_{out}$ thereof is held at the "L" level. Therefore, the analog input voltage can be known by measuring the period $t_1$ in which the clock pulse $\phi$ appears or is present at the output $V_{out}$ or by counting the number of such clock pulses in a counter, etc.

The above converter circuit, however, is accompanied by the following drawbacks.

(1) In the general integration type A-D converter as shown in FIG. 5, the operation of the circuit is based on the period from the time when the capacitor $C_o$ is discharged to zero volts to the time when the capacitor $C_o$ is charged up to the input voltage. Therefore, the charging and discharging operation consumes a certain time period and the conversion speed or the response time becomes slow or long.

(2) Since the transistor $Q_o$ performs repeated on-off operations, there arises the residual voltage. Then, the terminal voltage of the capacitor may not fall completely to the ground level. That is, the ground level differs for each operation. Then, no accurate conversion can be achieved.

(3) The on-resistance of the transistor $Q_o$ has a dispersion from the designed value in manufacture. This leads to different discharging time constant from one transistor to another. When mass-production is employed, the reproducibility is poor and the yield cannot be improved.

SUMMARY OF THE INVENTION

Therefore, an object of this invention is to provide an A-D converter capable of solving all the conventional problems.

Another object of this invention is to provide an A-D converter of voltage-time conversion type having a short response time.

A further object of this invention is to provide an A-D converter utilizing a charging and discharging circuit including a capacitor and a switching element, capable of achieving accurate A-D conversion.

Another object of this invention is to provide an A-D converter of integration type free from the influence of the dispersion of the discharging time constant due to the manufacturing dispersion of the on-resistance of the discharging switching element.

Another object of this invention is to provide a clock-operated integrating A-D converter of reduced A-D conversion error.

Another object of this invention is to provide an A-D converter adapted for use in an exposure display system of camera integrated circuits (ICs).

According to a typical aspect of this invention for achieving the above objects, there is provided an A-D converter comprising at least first and second voltage comparators, each having two input terminals and an output terminal, and a charging and discharging circuit including a capacitor connected between first and second power supply terminals through a constant-current source circuit and a switching means connected in parallel to the capacitor and controlled by a charging and discharging control signal, the first voltage comparator having one input terminal applied with an input voltage and the other input terminal connected to the first power supply terminal through the constant-current source circuit, the second voltage comparator having one input terminal applied with a reference voltage predetermined in relation with the input voltage and the other input terminal connected to the other terminal of the first voltage comparator. When the terminal voltage of the capacitor decreases below the reference voltage in the discharging operation, the discharging action is stopped. A converted signal is generated on the basis of the outputs of the first and the second voltage comparators, i.e. when the terminal voltage is between the reference and the input voltages. When the terminal voltage of the capacitor increases above the input voltage in the charging operation, the converted signal is stopped on the basis of the outputs of the first and the second voltage comparators.

Other objects, features and advantages of this invention will become apparent from the following detailed description of the preferred embodiments of this invention when taken in conjunction with the accompanying drawings.

BRIEF DESCRIPTION OF THE DRAWINGS

FIG. 1B is a chart of voltage waveforms for explaining the operation of the circuit of FIG. 1A.

DETAILED DESCRIPTION OF THE PREFERRED EMBODIMENTS

Hereinbelow, description will be made concretely in detail by way of embodiments referring to the accompanying drawings.

Figure 1A:
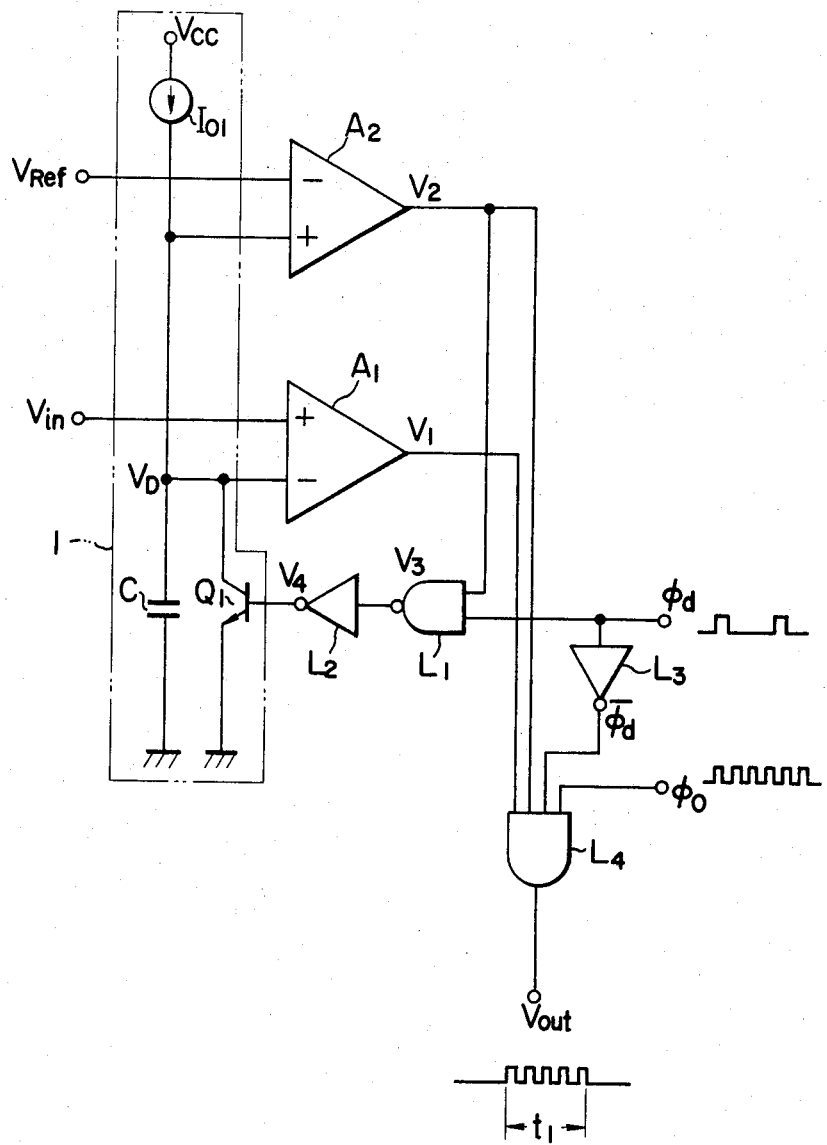
FIG. 1A is a circuit diagram of an A-D converter according to an embodiment of this invention.

FIG. 1A shows an embodiment of an A-D converter comprising first and second voltage comparators $A_1$ and $A_2$, each formed of an operational amplifier having two input terminals comprising a noninverting input terminal (+) which provides in-phase in the direction of change in the output signal to the input signal in the operational amplifier and an inverting input terminal (−) which provides opposite-phase in the direction of change therein and an output terminal, and a charging and discharging circuit 1 including a series connection of a constant current source circuit $I_{ol}$ and a capacitor C connected between a voltage ($V_{cc}$) source terminal and a ground potential terminal GND and a switching npn transistor $Q_1$ connected between the interconnection point of the capacitor C and the constant current source circuit $I_{ol}$ and the ground potential terminal GND. The above-mentioned first voltage comparator $A_1$ has the noninverting input terminal (+) applied with an analog input voltage $V_{in}$ and the inverting input terminal (−) connected to the output point of the charging and discharging circuit 1, i.e., the terminal voltage point of the capacitor C. The second voltage comparator $A_2$ has the noninverting input terminal (+) connected to the output point of the charging and discharging circuit 1 and the inverting input terminal (−) applied with a reference voltage $V_{ref}$ predetermined in relation with and being lower than the minimum value of the input analog voltage $V_{in}$. For example, in the case of exposure display systems of camera ICs as described later, this analog input voltage based on the brightness of the scene never becomes null potential. Then, the minimum value of the voltage may be selected to one corresponding to the brightness of the scene on a rainy day (corresponding to the lowest allowable image level). The reference voltage $V_{ref}$ may be determined to be slightly lower than this minimum voltage. A charge-discharge control signal $V_4$ is applied to the gate of the switching npn transistor $Q_1$. The control signal $V_4$ is formed by taking a NAND logic of a pulse signal $\phi_d$ arriving at a constant interval and the output $V_2$ of the second voltage comparator $A_2$ in a NAND logic circuit $L_1$ and inverting the output $V_3$ of the NAND logic circuit $L_1$ in an inverter circuit $L_2$. An AND logic circuit $L_4$ is provided to take the AND logic of four inputs; the outputs $V_1$ and $V_2$ of the voltage comparators $A_1$ and $A_2$, the output $\overline{\phi_d}$ of an inverter circuit $L_3$ for inverting the pulse signal $\phi_d$, and a clock pulse $\phi_o$.

The pulse width of the pulse signal $\phi_d$ has a longer time interval than a CR time constant in a discharge circuit consisting of the transistor $Q_1$ and the capacitor C, and duration of the constant interval thereof is determined by a maximum number of the clock pulse $\phi_d$ to be derived and counted as an output signal from the output of the AND logic circuit $L_4$. The repeated frequency of the clock pulse signal $\phi_o$ is determined according to conversion accuracy required for an A-D converter. The output $V_{out}$ of this AND circuit $L_4$ constitutes the output of the A-D converter.

According to the above structure, the purposes of this invention can be achieved as can be seen from the following description of the operation.

FIG. 1B shows voltage waveforms at various points in the circuit of FIG. 1A. Following description of the operation of the circuit will be made in conjunction with FIGS. 1A and 1B. The interval of the chargedischarge control or timing pulse $\phi_d$ and the period of arrival of the clock pulse $\phi_o$ are assumed to be as shown in FIG. 1B.

First, when the supply voltage $V_{cc}$ is applied, the capacitor C of the charging and discharging circuit 1 is charged by the supply voltage $V_{cc}$ through the constant current source circuit $I_{ol}$. Thus, the terminal voltage $V_D$ of the capacitor C comes to the $V_{cc}$ level (the dotted broken line in FIG. 1B showing the terminal voltage $V_D$). Provided that the analog input voltage $V_{in}$ has a waveform as shown by the solid line in FIG. 1B, the output voltage $V_1$ of the first voltage comparator $A_1$ at such conditions takes the low level "0" since the voltage $V_D$ at the inverting input terminal (−) is higher than the voltage $V_{in}$ at the noninverting input terminal (+). Further, if the reference voltage $V_{ref}$ is selected to be as shown by the dotted line in FIG. 1B satisfying the above-mentioned condition, the output $V_2$ of the second voltage comparator $A_2$ becomes of the high level "1" since the voltage $V_D$ at the noninverting input terminal (+) is higher than the voltage $V_{ref}$ at the inverting input terminal (−). Then, due to the low level "0" of the output $V_1$ of the first voltage comparator $A_1$, the output $V_{out}$ of the AND logic circuit $L_4$ is at the low level "0" regardless of the levels of the other inputs.

Next, when the charge-discharge control pulse $\phi_d$ is applied (i.e., reaches "1" level) at the timing as shown in FIG. 1B, the NAND logic circuit $L_1$ is opened by the "1" levels of this pulse $\phi_d$ and the output $V_2$ of the second voltage comparator $A_2$ to generate "0" level at the output $V_3$. Hence, the output $V_4$ of the inverter $L_2$ reaches "1" level to turn on the switching transistor $Q_1$. Upon the turning-on of the transistor $Q_1$, the capacitor C begins discharging and the terminal voltage $V_D$ of the capacitor C begins to fall toward the ground level GND. Here, the pulse width of the timing pulse $\phi_d$ is selected to be slightly longer than the discharging time of the capacitor C in relation to the reference voltage $V_{ref}$.

During discharge of this capacitor C, the terminal voltage $V_D$ decreases and the output states at various points of the circuit vary accordingly. Namely, when the terminal voltage $V_D$ of the capacitor C decreases below the analog input voltage $V_{in}$, the input voltage $V_{in}$ at the noninverting input terminal (+) of the voltage comparator $A_1$ becomes higher than the other input voltage $V_D$ and hence the output $V_1$ of the first voltage comparator $A_1$ is reversed to high level "1". Further, when the terminal voltage $V_D$ of the capacitor C decreases below the reference voltage $V_{ref}$, the second voltage comparator $A_2$ takes "0" level since the input voltage $V_{ref}$ at the inverting input terminal (−) becomes higher than the other input voltage $V_D$ at the noninverting input terminal (+).

At the moment when the output $V_2$ of the second voltage comparator $A_2$ reaches "0" level, the output $V_3$ of the NAND logic circuit $L_1$ is inverted to "1" level and hence the output $V_4$ of the inverter $L_2$ is inverted to "0" level. Therefore, the switching transistor $Q_1$ is turned off at the timing, after the "0" inversion of the output of the second voltage comparator $A_2$, determined by the response time of the NAND circuit $L_1$, the inverter $L_2$ and the transistor $Q_1$. Thus, the capacitor C begins charging again.

Then, the terminal voltage $V_D$ of the capacitor becomes lower than the reference voltage $V_{ref}$ irrespective of the output $V_2$ having "0" level because of delayed response in the NAND circuit $L_1$, inverter $L_2$ and transistor $Q_1$ to the output $V_2$, i.e. because of a total delay time of the NAND circuit $L_1$, inverter $L_2$ and transistor $Q_1$. When the terminal voltage $V_D$ of the capacitor C becomes higher than the reference voltage $V_{ref}$ again, the output $V_2$ of the second voltage comparator $A_2$ becomes of "1" level. At this timing, the output $V_1$ of the first voltage comparator $A_1$ is at "1" level and the charge-discharge timing pulse $\phi_d$ is at "0" level, and therefore the inverted signal $\overline{\phi}_d$ is at "1" level and the clock pulse $\phi_o$ directly appears at the output $V_{out}$ of the converter through the AND circuit $L_4$.

Further, when the terminal voltage $V_D$ of the capacitor C exceeds the input voltage $V_{in}$ by the charging of the capacitor C, the output $V_1$ of the first voltage comparator is inverted to the low level "0" since the voltage $V_D$ at the inverting input terminal (−) becomes higher than the voltage at the noninverting input terminal (+). Therefore, the output $V_{out}$ of the AND circuit $L_4$ becomes of low level "0".

As can be seen from the above, the digital representation of the analog input voltage can be achieved by measuring the period $t_1$ in which the clock pulse is present at the output terminal $V_{out}$ or by counting the number of arriving clock pulses in a counter etc.

Further, even when the level of the input voltage $V_{in}$ is relatively low, clock pulses appear at the output terminal $V_{out}$ through similar operations as shown in the period $t_2$ of FIG. 1B. The digital conversion can be achieved by measuring the period or number of arriving clock pulses under such conditions.

The A-D conversion is achieved in a similar manner in the following cases.

As is apparent from the above description of the embodiment, various advantages as described below can be obtained according to this invention.

(1) The charge on the capacitor C of the charging and discharging circuit 1 is not discharged completely to zero volts, but is stopped when the terminal voltage becomes lower than the reference voltage $V_{ref}$. Then, charging of the capacitor C is conducted. The conversion operation is initiated at the moment when the charging voltage exceeds the above-mentioned reference voltage $V_{ref}$. Therefore, the conversion speed is enhanced compared to the conventional case of completely discharging the capacitor to zero (GND) potential and then initiating the conversion action.

(2) According to the conventional method, the on-off operation of the transistor $Q_1$ is achieved repeatedly. Thus, there arises the problem of residual voltage; the capacitor C may not be completely discharged. According to the present method, the capacitor C may not be completely discharged and hence the above problem is disregarded. Therefore, the conversion accuracy is improved.

(3) Even when the on-resistance of the transistor $Q_1$ has some extent of dispersion with respect to the designed value, such dispersion has lower influence to the discharging time constant since the capacitor C cannot be completely discharged to the null voltage. The discharging operation is stopped in the neighborhood of the reference voltage $V_{ref}$ and the above dispersion has no longer material influence to the discharging time constant determined by the product of the capacitance of the capacitor C and the on-resistance of the transistor $Q_1$ as is the case with the conventional circuit. Thus, a larger yield can be expected in the case of mass-production.

Figure 2:
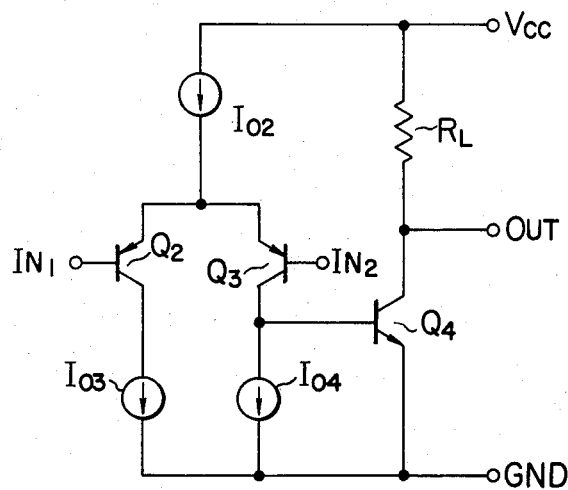
FIG. 2 is a circuit diagram of an example of the voltage comparator to be used in this invention.

FIG. 2 shows a concrete example of the circuit of the voltage comparators $A_1$ and $A_2$ to be used in the analog-to-digital converter circuit of this invention.

In the circuit, emitter-coupled npn transistors $Q_2$ and $Q_3$ have respective bases supplied with inputs $IN_1$ and $IN_2$. The common emitter is connected to a supply voltage ($V_{cc}$) terminal through a constant current source circuit $I_{o2}$. The collectors are connected to a ground (GND) terminal through respective constant current source circuits $I_{o3}$ and $I_{o4}$. A load resistor $R_L$ and an npn transistor $Q_4$ are connected in series between the supply voltage $V_{cc}$ and the ground GND to form an output circuit. The output $V_{out}$ of the circuit is derived from the connection node of the resistor $R_L$ and the transistor $Q_4$. The base of the transistor $Q_4$ of the differential pair transistors $Q_3$ and $Q_4$ is connected to the collector of the emitter-coupled transistor $Q_3$. By the use of the voltage comparators formed of bipolar transistors as shown in FIG. 2, they can be integrated in a one-chip semiconductor substrate in an IC together with other circuit components of the converter structure. Thus, the degree of integration can be improved.

The structure of the voltage comparator is not restricted to one shown in the figure but may be of any type.

Figure 3:
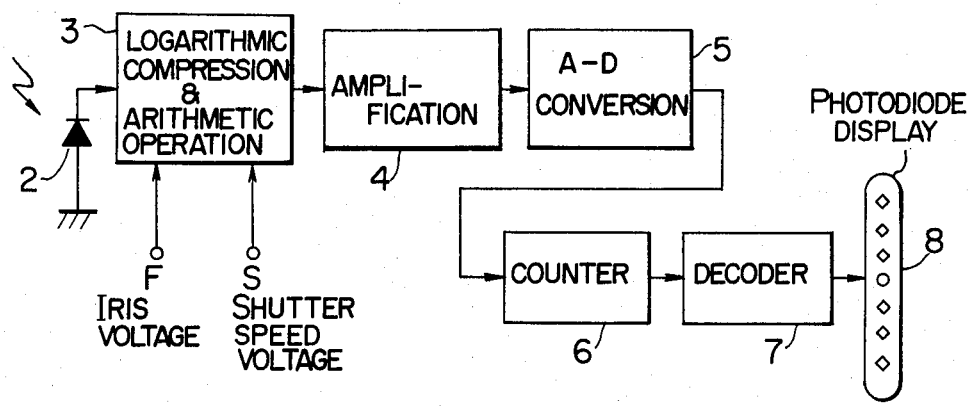
FIG. 3 is a circuit block diagram of an application example of the present A-D converter.

FIG. 3 shows the exposure display system of camera IC embodying the present A-D converter. This circuit achieves alarm display of over-exposure and under-exposure.

As shown in the figure, the brightness of the scene is detected in a photoelectric converter 2 such as a GaAsP photodiode or a CdS photoconductive cell. The detected photocurrent is logarithmically compressed by utilizing collector current (IC) vs. base-to-emitter voltage ($V_{BE}$) characteristics of a bipolar transistor. On the other hand, the selected F-value (iris) and the shutter speed including the exposure index (ASA) are converted into voltage to provide an F-voltage F and a shutter speed voltage S. These three voltage signals are inputted into an arithmetic circuit 3 and calculated therein to provide an output corresponding to the respective input voltages. This output voltage is amplified by an amplifier 4. The amplified output is converted into a digital value in an A-D converter 5. This digital value is counted in a counter 6 to provide the count signal to a decoder 7 having a driver function. The decoder 7 serves to convert the counted signal into a driver signal for display. An appropriate photodiode, i.e. the corresponding light emitting diode (LED), in a LED array display 8, for example of 7 dots, is turned on by this decoder 7. Arrangement is performed that the appropriate exposure is provided when the central LED is turned on as shown in the figure. This method is called the fixed point display method.

When the A-D converter of the foregoing embodiment is used in such a system, high accuracy exposure display can be achieved.

This invention is not restricted for use in the exposure display system of camera ICs as described above, but may be applied in various uses, such as a data logger in measuring systems or digital computing systems.

Figure 4A:
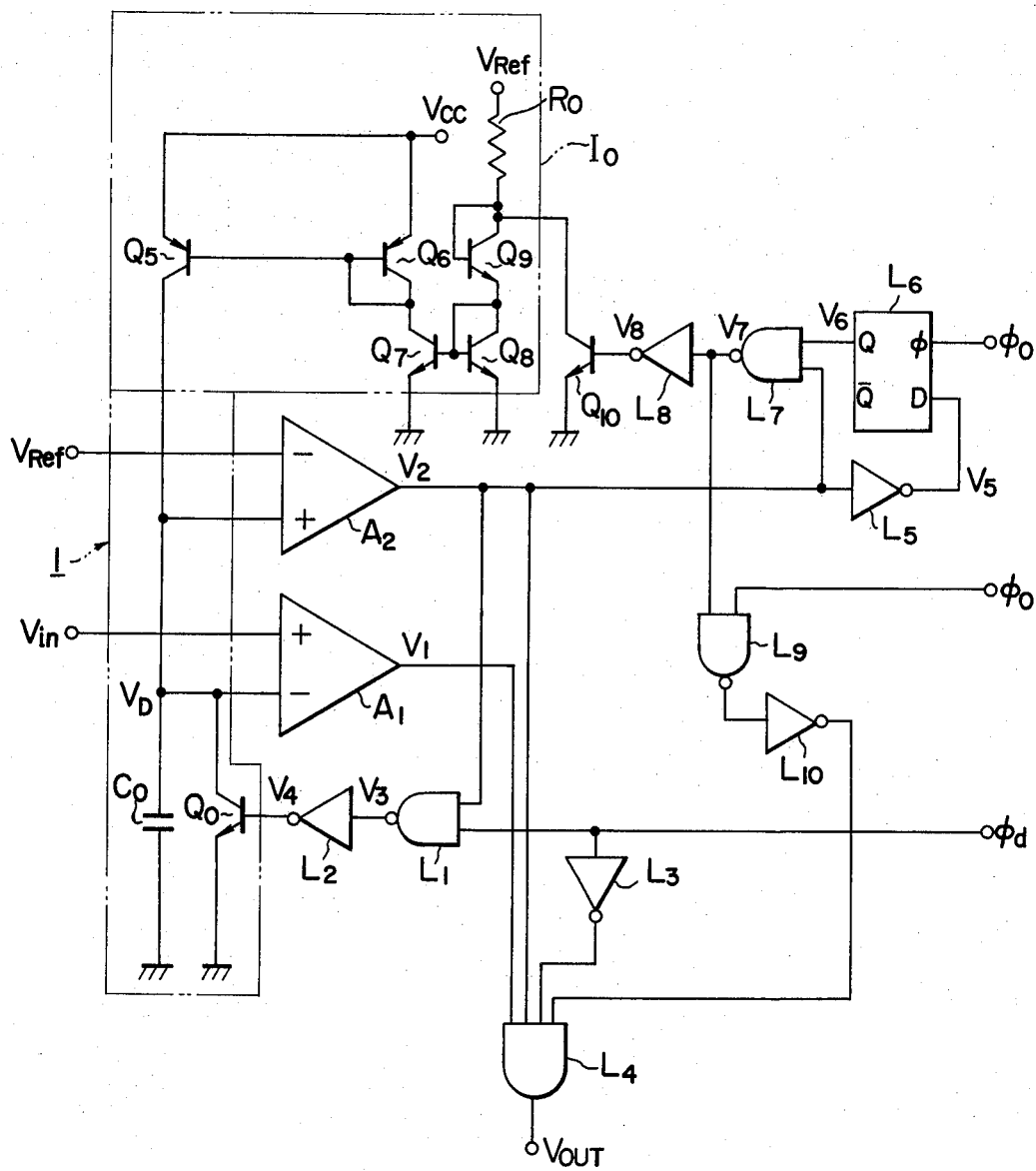
FIG. 4A is a circuit diagram of an A-D converter according to another embodiment of this invention.

FIG. 4A shows another embodiment of the A-D converter of this invention, in which a constant current circuit $I_o$ constituting a charging and discharging circuit 1 is formed of transistors $Q_5$ to $Q_9$ and the circuit operation is controlled by a switching transistor $Q_{10}$.

Figure 4B:
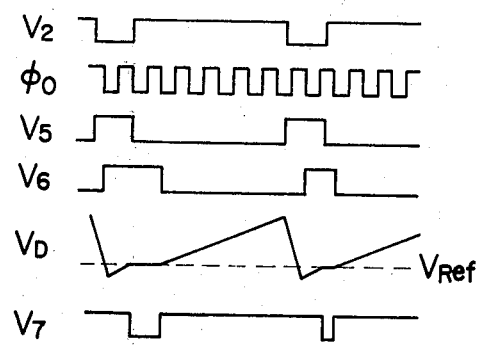
FIG. 4B is a chart of voltage waveforms for explaining the operation of the circuit of FIG. 4A.
Figure 5:
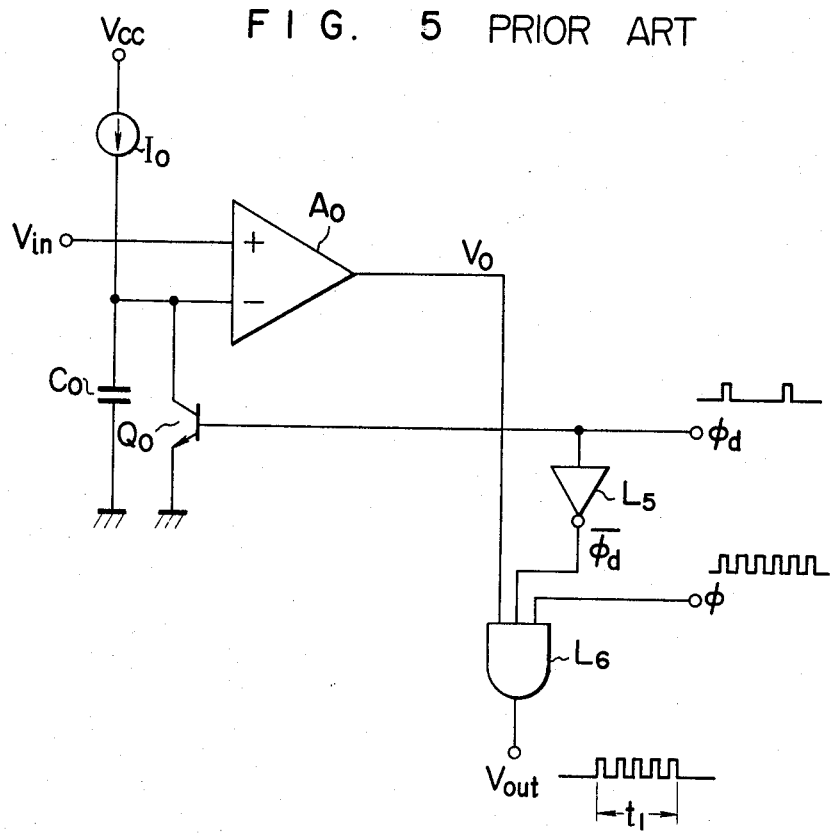
FIG. 5 is a circuit diagram of an example of the conventional A-D converter.

That is, the first pair of pnp transistors $Q_5$ and $Q_6$ construct a first current mirror circuit while the second pair of npn transistors $Q_7$ and $Q_8$ construct a second current mirror circuit. A series circuit of a resistor $R_o$ and a diode-connected transistor $Q_9$ provides a D.C. current to the transistor $Q_8$ from a voltage supply $V_{ref}$. The D.C. current through the transistor $Q_8$ is controlled by the transistor $Q_{10}$. Further, a control circuit for controlling the transistor $Q_{10}$ comprises inverter circuits $L_5$, $L_8$ and $L_{10}$, NAND circuits $L_7$ and $L_9$ and a delayed flip-flop circuit $L_6$. Voltage waveforms at various points in the circuit of FIG. 4A are shown in FIG. 4B. In this embodiment, charging is stopped from the time when the terminal voltage of a capacitor $C_o$ reaches the reference voltage $V_{ref}$ to the time of arrival of the next clock pulse to hold the terminal voltage at $V_{ref}$. By this arrangement, the period required for the terminal voltage to rise from the reference voltage $V_{ref}$ to an unknown input voltage can be accurately digitalized. According to this embodiment, the conversion error can be reduced compared to the case where the timing of the terminal voltage of the capacitor $C_o$ reaching the reference voltage $V_{ref}$ is not synchronized with the clock pulse.

What is claimed is:

1. An electronic circuit with a charging and discharging circuit comprising:

a series circuit of a current limiting means and a capacitor connected between a power supply terminal and a ground terminal so that one end terminal of said capacitor in said series circuit is connected to said ground terminal while one end terminal of said current limiting means is connected to said power supply terminal;

a switching means connected in parallel with said capacitor to provide a discharge path for said capacitor when the switching means is conductive, said switching means having a control electrode for controlling the conductivity thereof;

a first voltage comparator having two input terminals and an output terminal, one of said two input terminals being connected to the juncture between said current limiting means and said capacitor so as to supply the terminal voltage appearing across said capacitor to said one input terminal of said first voltage comparator;

a reference voltage source connected between the other input terminal of said first voltage comparator and said ground terminal so as to provide a predetermined voltage to said other input terminal of the first voltage comparator;

a first pulse source coupled to the control electrode of said switching means through a first logic means, wherein said first pulse source generates a control pulse signal which alternately repeats a first predetermined period of a first voltage level and a second predetermined period of a second voltage level, said first predetermined period of the control pulse signal being provided to determine the time during which said switching means is rendered conductive, while said second predetermined period of the control pulse signal is provided to determined the time during which said switching means is rendered nonconductive; and wherein said first logic means includes two input terminals connected to said output terminal of the first voltage comparator and said first pulse source respectively, and an output terminal connected to said control electrode of the switching means, for causing said switching means to be conductive so as to permit said capacitor to be discharged during a first portion of said first predetermined period when the terminal voltage of said capacitor is higher than said predetermined voltage of the reference voltage source, and causing said switching means to be non-conductive so as to stop capacitor from being discharged through said switching means during a second portion of said first predetermined period when the terminal voltage of said capacitor becomes lower than said predetermined voltage of the reference voltage source, thereby to prevent unnecessary discharging of the capacitor through said switching means after the terminal voltage of said capacitor becomes lower than a predetermined voltage in said first predetermined period of the control pulse signal;

an output terminal connected to the juncture of said series circuit for deriving an output signal voltage appearing across said capacitor, and a second voltage comparator having two input terminals and an output terminal, one input terminal of said second voltage comparator being supplied with an analog input voltage while the other input terminal of said second voltage comparator is connected to said output terminal of the series circuit, thereby to derive an output pulse signal having its pulse width corresponding to the amplitude of said analog input voltage from said output terminal of the second voltage comparator, further comprising:

a second pulse source for generating a clock pulse signal which alternately repeats a third predetermined period of a higher voltage level and a fourth predetermined period of a lower voltage level and has a frequency of the alternating repetitions higher than that of said control pulse signal; and a second logic means for receiving, at least, the output pulse signals at the output terminals of said first and second voltage comparators and said clock pulse signal, and passing said clock pulse signal during the period when the terminal voltage of said capacitor is in the range between said predetermined voltage of the reference voltage source and said analog input voltage in said second predetermined period of the control signal and thereby obtaining a digital output signal which has the number of clock pulses corresponding to the value of said analog input voltage in said second predetermined period of the control pulse signal.

2. An electronic circuit according to claim 1, further comprising a holding circuit means, coupled between said output terminal of the first voltage comparator and said series circuit, for stopping the supply of power to said series circuit and thereby holding the terminal voltage of said capacitor in the vicinity of said predetermined voltage of the reference voltage source.

3. An electronic circuit according to claim 1, wherein said second predetermined period of the control pulse signal is selected to be longer than said first predetermined period thereof.

4. An electronic circuit with a charging and discharging circuit comprising:

a series circuit of a current limiting means and a capacitor connected between a power supply terminal and a ground terminal so that one end terminal of said capacitor in said series circuit is connected to said ground terminal while one end terminal of said current limiting means is connected to said power supply terminal;

a switching means connected in parallel with said capacitor to provide a discharge path for said capacitor when the switching means is conductive, said switching means having a control electrode for controlling the conductivity thereof;

a first voltage comparator having two input terminals and an output terminal, one of said two input terminals being connected to the juncture between said current limiting means and said capacitor so as to supply the terminal voltage appearing across said capacitor to said one input terminal of said first voltage comparator;

a reference voltage source connected between the other input terminal of said first voltage comparator and said ground terminal so as to provide a predetermined voltage to said other input terminal of the first voltage comparator;

a first pulse source coupled to the control electrode of said switching means through a first logic means, wherein said first pulse source generates a control pulse signal which alternately repeats a first predetermined period of a first voltage level and a second predetermined period of a second voltage level, said first predetermined period of the control pulse signal being provided to determine the time during which said switching means is rendered conductive, while said second predetermined period of the control pulse signal is provided to determine the time during which said switching means is rendered non-conductive; and wherein said first logic means includes two input terminals connected to said output terminal of the first voltage comparator and said first pulse source respectively, and an output terminal connected to said control electrode of the switching means, for causing said switching means to be conductive so as to permit said capacitor to be discharged during a first portion of said first predetermined period when the terminal voltage of said capacitor is higher than said predetermined voltage of the reference voltage source, and causing said switching means to be non-conductive so as to stop said capacitor from being discharged through said switching means during a second portion of said first predetermined period when the terminal voltage of said capacitor becomes lower than said predetermined voltage of the reference voltage source, thereby to prevent unnecessary discharging of the capacitor through said switching means after the terminal voltage of said capacitor becomes lower than a predetermined voltage in said first predetermined period of the control pulse signal; and an output terminal connected to the juncture of said series circuit for deriving an output signal voltage appearing across said capacitor, further comprising:

a holding circuit means, coupled between said output terminal of the first voltage comparator and said series circuit, for stopping the supply of power to said series circuit and thereby holding the terminal voltage of said capacitor in the vicinity of said predetermined voltage of the reference voltage source.

5. In an electronic circuit with a charging and discharging circuit comprising:

a charging and discharging circuit including a capacitor and a switching means coupled to said capacitor for enabling said capacitor to charge or discharge, said switching means having a control electrode for controlling the conductivity thereof; and a control pulse signal supplied to said control electrode of the switching means for defining the period of charging or discharging action of said capacitor, said control signal having a predetermined voltage level generated during said period to cause said switching means to be conductive or non-conductive, the improvements in said electronic circuit comprising:

a first voltage comparator means for comparing the terminal voltage appearing across said capacitor with a reference voltage and delivering an output signal;

a first logic means for applying said control pulse signal to said switching means, said first logic means receiving the output signal of said first voltage comparator means and said control pulse signal, and inhibiting said predetermined voltage level of said control signal from being supplied to said control electrode of the switching means at the time when the terminal voltage of said capacitor has a predetermined relationship to said reference voltage in the period of said control pulse signal, thereby to prevent unnecessary charging or discharging action defined in said period of said control pulse signal;

a second voltage comparator means for comparing the terminal voltage of said capacitor with an analog input voltage and delivering an output signal having a pulse width corresponding to the amplitude of said analog input voltage; and a second logic means for receiving the output signals of said first and second voltage comparator means and a clock pulse signal, and passing said clock pulse signal within the period corresponding to said pulse width of the output signal of the second voltage comparator means and thereby obtaining a digital output signal which has the number of clock pulses corresponding to the value of said analog voltage, further comprising;

a third logic means for receiving the output signal of said first voltage comparator means and for stopping the supply of power to said charging and discharging circuit.

6. An analog-to-digital (A-D) converter circuit comprising:

a charging and discharging circuit connected between a pair of power supply terminals, and including a parallel connection of a capacitor and a switching means, said switching means having a control electrode for controlling the conductivity of said switching means;

first and second voltage comparators, each having two input terminals and an output terminal, one input terminal of said first voltage comparator being supplied with an analog input voltage while the other input terminal of said first voltage comparator is connected to said capacitor so as to supply the terminal voltage appearing across said capacitor to said first voltage comparator, and one terminal of said second voltage comparator being connected to said other terminal of the first voltage comparator while the other terminal of said second voltage comparator is supplied with a reference voltage predetermined in relation to said input voltage;

a first pulse source for generating a control pulse signal which alternately repeats a first predetermined period of a first voltage level and a second predetermined period of a second voltage level;

a second pulse source for generating a clock pulse signal which alternately repeats a third predetermined period of the first voltage level and a fourth predetermined period of the second voltage level and has a frequency of the alternating repetitions higher than that of said control pulse signal;

a first logic means for receiving said control pulse signal and the output signal appearing at the output terminal of said second voltage comparator, said first logic means producing a driving signal to cause said switching means to be conductive and thereby to permit said capacitor to be discharged during the period when the terminal voltage of said capacitor is higher than said reference voltage in said first predetermined period of the control pulse signal;

a second logic means for receiving the output signals at the output terminals of said first and second voltage comparators, and said clock pulse signal, and passing said clock pulse signal during the period when the terminal voltage of said capacitor is in the range between the reference voltage and the analog input voltage in said second predetermined period of the control pulse signal and thereby obtaining a digital output signal corresponding to the value of said analog input voltage in said second predetermined period of the control pulse signal; and a holding circuit, coupled between said output terminal of the second voltage comparator and said charging and discharging circuit, for holding the terminal voltage of said capacitor at said reference voltage by stopping the supply of power to said charging and discharging circuit from the time when the terminal voltage of said capacitor reaches said reference voltage by the discharging action of said switching means to the time of arrival of the next clock pulse of said clock pulse signal.

7. An A-D converter circuit according to claim 6, wherein said second predetermined period of the control pulse signal is selected to be longer than said first predetermined period thereof.

8. An A-D converter circuit according to claim 6, wherein said holding circuit comprises a constant current source circuit for providing the charging current to said charging and discharging circuit and third logic means for stopping operation of said constant current source circuit during a predetermined period by the output signal at the output terminal of said second voltage comparator.

* * * * *